(12) United States Patent
Kubota et al.

(10) Patent No.: US 9,224,684 B2
(45) Date of Patent: Dec. 29, 2015

(54) WIRING BOARD AND METHOD OF MANUFACTURING WIRING BOARD

(71) Applicant: SHINKO ELECTRIC INDUSTRIES CO., LTD., Nagano-shi, Nagano (JP)

(72) Inventors: Kazuyuki Kubota, Nagano (JP); Tomoharu Fujii, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 45 days.

(21) Appl. No.: 14/167,280

(22) Filed: Jan. 29, 2014

(65) Prior Publication Data

US 2014/0209366 A1 Jul. 31, 2014

(30) Foreign Application Priority Data

Jan. 31, 2013 (JP) .................. 2013-016678

(51) Int. Cl.
*H05K 1/16* (2006.01)
*H01L 23/50* (2006.01)
*H05K 1/02* (2006.01)
*H05K 3/46* (2006.01)
*H01L 23/58* (2006.01)

(Continued)

(52) U.S. Cl.
CPC ................ *H01L 23/50* (2013.01); *H01L 23/58* (2013.01); *H05K 1/0271* (2013.01); *H05K 3/4602* (2013.01); *H01L 25/105* (2013.01); *H01L 2224/16237* (2013.01); *H01L 2924/15321* (2013.01); *H05K 1/16* (2013.01); *H05K 1/185* (2013.01); *H05K 3/108* (2013.01); *H05K 3/429* (2013.01); *H05K 3/462* (2013.01); *H05K 3/4644* (2013.01); *H05K 2201/0162* (2013.01); *H05K 2201/0187* (2013.01); *H05K 2201/0195* (2013.01); *H05K 2201/0218* (2013.01); *H05K 2201/0355* (2013.01); *H05K 2201/09536* (2013.01); *H05K 2201/10037* (2013.01); *H05K 2201/10151* (2013.01); *H05K 2203/1461* (2013.01); *H05K 2203/1469* (2013.01)

(58) Field of Classification Search
CPC ............. H05K 1/02; H05K 1/16; H05K 3/00; H05K 3/30; H05K 3/46; H05K 7/00; H05K 7/02; H05K 7/06; H01L 21/02; H01L 21/52; H01L 21/56; H01L 21/60; H01L 23/02; H01L 23/04; H01L 23/498
USPC ........... 174/260, 255; 361/728, 762; 429/123, 429/149, 161; 257/686, 698, 700, 774; 29/846
See application file for complete search history.

(56) References Cited

U.S. PATENT DOCUMENTS 4,924,282 A * 5/1990 Komiyama et al. ............ 358/471
5,673,127 A * 9/1997 Takahara et al. .............. 349/140

(Continued)

FOREIGN PATENT DOCUMENTS

JP 2001-217337 8/2001

*Primary Examiner* — Xiaoliang Chen
(74) *Attorney, Agent, or Firm* — Rankin, Hill & Clark LLP

(57) ABSTRACT

There is provided a wiring board. The wiring board includes: a first insulating layer; a secondary battery on one surface of the first insulating layer; a second insulating layer formed on the secondary battery; a third insulating layer covering the second insulating layer; a first wiring layer on one surface of the third insulating layer; and a via electrically connecting the first wiring layer to an electrode of the secondary battery. A rigidity of the second insulating layer is lower than those of the first and third insulating layers.

7 Claims, 7 Drawing Sheets

(51) Int. Cl.
*H01L 25/10* (2006.01)
*H05K 1/18* (2006.01)
*H05K 3/10* (2006.01)
*H05K 3/42* (2006.01)

(56) References Cited

U.S. PATENT DOCUMENTS

| | | | |
|---|---|---|---|
| 2001/0027875 A1* | 10/2001 | Kim et al. | 174/255 |
| 2002/0175402 A1* | 11/2002 | McCormack et al. | 257/700 |
| 2004/0214079 A1* | 10/2004 | Simburger et al. | 429/123 |
| 2005/0189139 A1* | 9/2005 | Stole | 174/260 |
| 2006/0087020 A1* | 4/2006 | Hirano et al. | 257/686 |
| 2007/0045814 A1* | 3/2007 | Yamamoto et al. | 257/698 |
| 2007/0045815 A1* | 3/2007 | Urashima et al. | 257/698 |
| 2007/0263364 A1* | 11/2007 | Kawabe et al. | 361/728 |
| 2007/0281394 A1* | 12/2007 | Kawabe et al. | 438/118 |
| 2008/0251285 A1* | 10/2008 | Sato et al. | 174/260 |
| 2009/0183829 A1* | 7/2009 | Rendek et al. | 156/285 |
| 2009/0185357 A1* | 7/2009 | Rendek et al. | 361/762 |
| 2009/0186169 A1* | 7/2009 | Shacklette et al. | 428/1.6 |
| 2010/0021816 A1* | 1/2010 | Stole | 429/211 |
| 2010/0238362 A1* | 9/2010 | Hughes et al. | 348/738 |
| 2010/0300602 A1* | 12/2010 | Ichiyanagi et al. | 156/89.12 |
| 2010/0300740 A1* | 12/2010 | Ichiyanagi et al. | 174/260 |
| 2010/0312625 A1* | 12/2010 | Miller et al. | 705/14.5 |
| 2012/0068359 A1* | 3/2012 | Mori et al. | 257/774 |

* cited by examiner

WIRING BOARD AND METHOD OF MANUFACTURING WIRING BOARD

This application claims priority from Japanese Patent Application No. 2013-016678, filed on Jan. 31, 2013, the entire contents of which are herein incorporated by reference.

BACKGROUND OF THE INVENTION

1. Technical Field

The present disclosure relates to a wiring board and a method of manufacturing a wiring board.

2. Description of the Related Art

In the related art, a wiring board containing an electronic component, such as a semiconductor chip or a resistive element, therein has been known (for example, see JP-A-2001-217337). The wiring board includes, for example, a base substrate that includes a resin layer and a resin layer that is formed on the base substrate. For example, the electronic component is mounted on the base substrate in the wiring board, and is embedded with a resin. For example, the resin is made of the same material as the material of the base substrate.

Incidentally, there is an electronic component such as a secondary battery whose volume changes due to the use thereof. When the electronic component whose volume changes as described above is embedded with the resin of the wiring board, there is a concern that the electronic component may be damaged. This leads to a defect of the wiring board.

SUMMARY OF THE INVENTION

According to one or more aspects of the present invention, there is provided a wiring board. The wiring board includes: a first insulating layer; a secondary battery on one surface of the first insulating layer; a second insulating layer formed on the secondary battery; a third insulating layer covering the second insulating layer; a first wiring layer on one surface of the third insulating layer; and a via electrically connecting the first wiring layer to an electrode of the secondary battery. A rigidity of the second insulating layer is lower than those of the first and third insulating layers.

DETAILED DESCRIPTION

Embodiments according to the present invention will be now described with reference to the accompanying drawings. Meanwhile, for convenience, characteristic portions of the accompanying drawings may be shown in an enlarged manner for easy understanding of the characteristic portions, and dimensions, ratios, and the like may be different from actual dimensions, actual ratios, and the like. Further, for easy understanding of the cross-sectional structure of each member, the hatching of a portion of the cross-sectional structure will be omitted herein.

Figure 1:
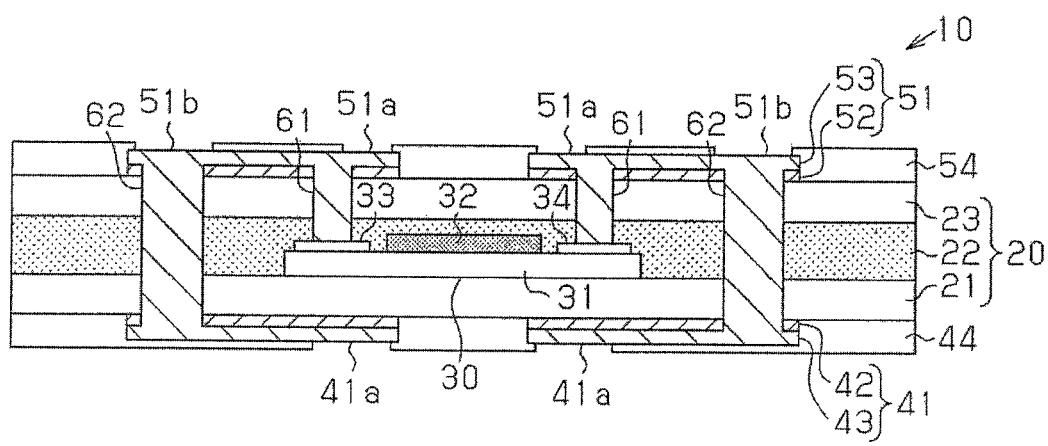
FIG. 1 is a schematic cross-sectional view of a wiring board according to an embodiment.

As shown in FIG. 1, a wiring board 10 includes a board body 20, and a secondary battery 30 is built in the board body 20. The board body 20 includes a plurality of (three in FIG. 1) insulating layers 21, 22, and 23. Among the insulating layers 21 to 23, the second insulating layer 22 and the third insulating layer 23 are formed on one main surface (the upper surface in FIG. 1) of the first insulating layer 21 in this order.

The materials of the first and third insulating layers 21 and 23 are resins, such as an epoxy resin, a polyimide resin, and a phenol resin. These resins are, for example, thermosetting resins. The material of the second insulating layer 22 is a resin (low-rigidity resin) whose rigidity is lower than the rigidities of the first and third insulating layers 21 and 23. This resin is, for example, silicone elastomer, silicone gel, or the like. The rigidity of the resin means the extent to which it resists deformation in response to an applied force. The rigidity of the resin is compared using, for example, tensile strength. A resin having a low value of tensile strength can be regarded as a resin that has a low rigidity. For example, the tensile strength of an epoxy resin, which is used for the first and third insulating layers 21 and 23, is in the range of 70 to 100 (Mpa). Meanwhile, the tensile strength of elastomer, which is used for the second insulating layer 22, is in the range of 0.5 to 10 (Mpa).

The secondary battery 30 is embedded in the second insulating layer 22. The secondary battery 30 is fixed to one main surface (the upper surface in FIG. 1) of the first insulating layer 21 by, for example, an adhesive, and is covered with the second insulating layer 22. The secondary battery 30 is an electronic component whose volume changes due to the use thereof, and is, for example, an all-solid-state thin film secondary battery that includes a lithium-based electrolyte layer.

The secondary battery 30 includes a substrate 31 and a battery body 32 and electrodes 33 and 34 that are provided on one main surface (the upper surface in FIG. 1) of the substrate 31. The substrate 31 is, for example, a silicon substrate. The materials of the electrodes 33 and 34 are, for example, aluminum (Al) or an aluminum alloy.

In the secondary battery 30, a second main surface (the lower surface in FIG. 1) opposite to a first main surface (the upper surface in FIG. 1) of the substrate 31 on which the battery body 32 is formed is fixed to the first insulating layer 21 by, for example, an adhesive. Accordingly, the second insulating layer 22 is formed so as to cover the battery body 32 and the electrodes 33 and 34, which are provided on the first main surface of the substrate 31, and the side surface of the substrate 31.

A wiring layer 41 is formed on one main surface (the lower surface in FIG. 1) of the first insulating layer 21. Likewise, a wiring layer 51 is formed on one main surface (the upper surface in FIG. 1) of the third insulating layer 23. The wiring layer 41 includes a metal foil 42 and a conductor layer 43. Likewise, the wiring layer 51 includes a metal foil 52 and a conductor layer 53. The materials of the metal foils 42 and 52 are, for example, copper or a copper alloy. The materials of the conductor layers 43 and 53 are, for example, copper or a copper alloy.

The wiring layer 51 is electrically connected to the electrodes 33 and 34 of the secondary battery 30 through vias 61.

The wiring layers 51 and 41 are electrically connected to each other through vias 62 that pass through the board body 20.

The lower surface of the first insulating layer 21 and a portion of the wiring layer 41 are covered with a solder resist 44. The upper surface of the third insulating layer 23 and a portion of the wiring layer 51 are covered with a solder resist 54. The solder resists 44 and 54 are examples of a protective film. The solder resists 44 and 54 are, for example, a resin, such as epoxy or polyester.

The wiring layer 51 includes pads 51a and 51b. The pads 51a and 51b are portions of the wiring layer 51 that are exposed to the outside through openings formed in the solder resist 54. The pads 51a are used for the mounting of, for example, an electronic component. The pads 51b are used for the connection of, for example, another wiring board. The wiring layer 41 includes pads 41a. The pads 41a are portions of the wiring layer 41 that are exposed to the outside through openings formed in the solder resist 44. The pads 41a are used for the mounting of, for example, an electronic component.

One example of the secondary battery 30 will be now described.

Figure 2:
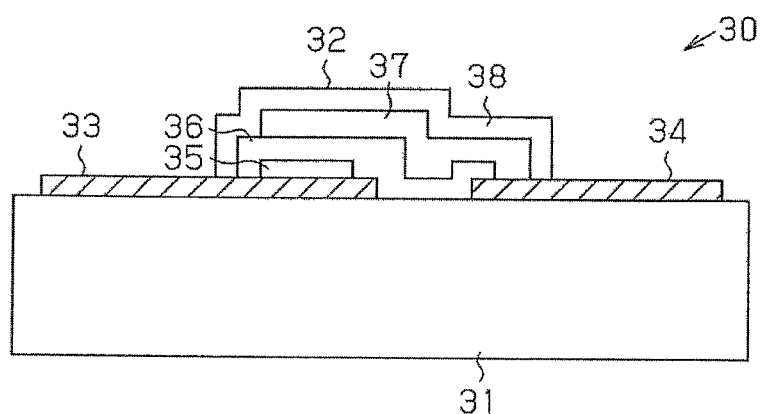
FIG. 2 is a schematic cross-sectional view of a secondary battery.

As shown in FIG. 2, the secondary battery 30 includes the substrate 31 and the battery body 32 that is provided on one main surface (the upper surface in FIG. 2) of the substrate 31. The battery body 32 includes the electrodes 33 and 34. These electrodes 33 and 34 are called collectors. The electrodes 33 and 34 are formed on the upper surface of the substrate 31. The battery body 32 includes a positive electrode 35, an electrolyte layer 36, and a negative electrode 37. The positive electrode 35, the electrolyte layer 36, and the negative electrode 37 are laminated on the electrode 33 in this order. The positive electrode 35, the electrolyte layer 36, and the negative electrode 37 are covered with a protective film 38. The negative electrode 37 is connected to one end of the electrode 34. The materials of the positive electrode 35 and the negative electrode 37 are, for example, aluminum or an aluminum alloy. The electrolyte layer 36 is, for example, a lithium electrolyte layer. The protective film 38 is made of, for example, an insulating resin.

Next, the operation of the wiring board 10 will be now described.

The secondary battery 30 is built in the wiring board 10. The secondary battery 30 is covered with the second insulating layer 22 that is interposed between the insulating layers 21 and 23 of the board body 20. Further, the rigidity of the second insulating layer 22 is lower than the rigidities of the first and third insulating layers 21 and 23.

The volume of the secondary battery 30 changes depending on the increase and decrease of the volume of the electrolyte layer 36 that is caused by charge and discharge. As described above, the second insulating layer 22 is made of a low-rigidity resin. For this reason, since the volume change of the secondary battery 30 is allowed when the volume of the secondary battery 30 changes, a force caused by the volume change is not easily given to the secondary battery 30. Accordingly, the second insulating layer 22 suppresses the damage of the secondary battery 30 whose volume changes due to the use thereof. The wiring board 10 becomes a defective product when the secondary battery 30 built in the wiring board 10 is damaged. Accordingly, it is possible to suppress the wiring board 10 to be a defective product.

Next, the example of the use of the wiring board 10 will be now described.

Figure 3:
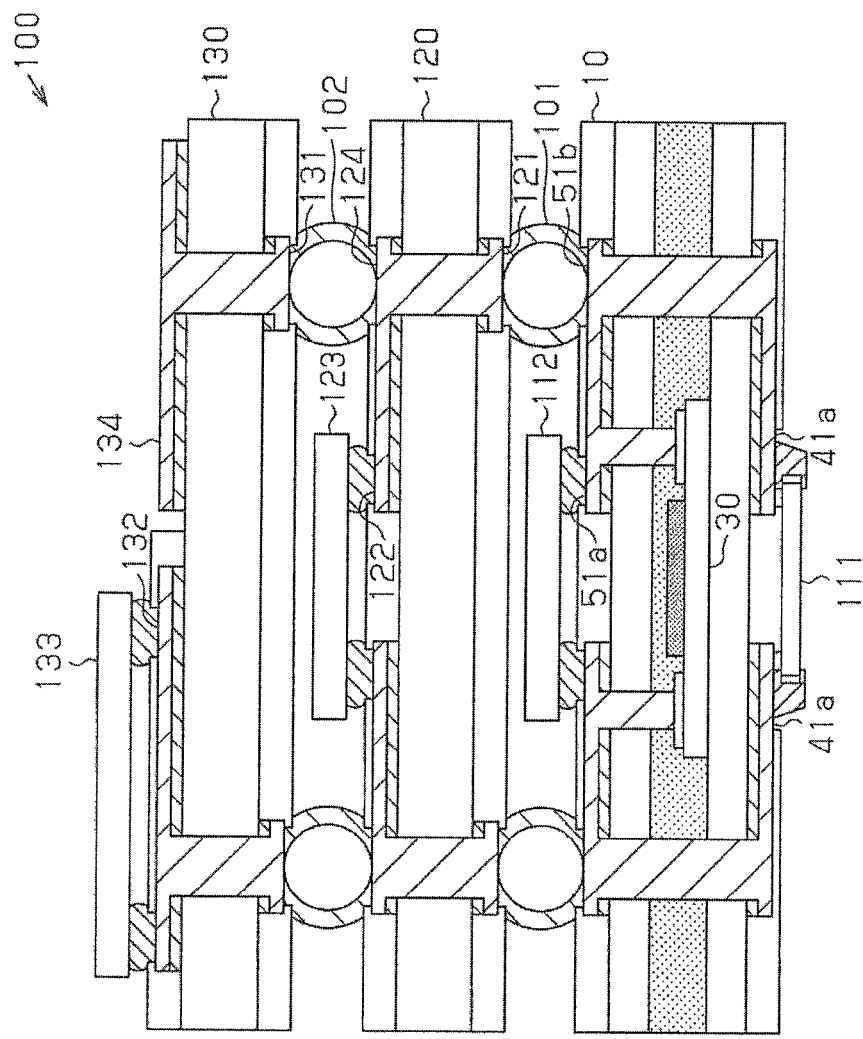
FIG. 3 is a schematic cross-sectional view of a semiconductor device including the wiring board according to the embodiment.

As shown in FIG. 3, a semiconductor device 100 includes a plurality of (three in FIG. 3) wiring boards 10, 120, and 130. An electronic component 111 is mounted on the pads 41a of the wiring board 10. The electronic component 111 is, for example, a power generator, such as a photovoltaic power generator, a thermoelectric power generator, or a vibration power generator, and supplies power to the secondary battery 30 that is built in the wiring board 10. An electronic component 112 is mounted on the pads 51a of the wiring board 10. The electronic component 112 is, for example, a power management IC, and manages the power of the secondary battery 30.

The pads 51b of the wiring board 10 are electrically connected to pads 121 of the wiring board 120 through solder balls 101. The solder ball 101 is a metal-core solder ball, and this metal is, for example, copper. Meanwhile, the solder ball 101 may be a solder ball including a resin core or a solder ball not including a metal core.

Each of the wiring boards 120 and 130 is a resin wiring board that is based on a double-sided copper-clad board using, for example, an epoxy resin as an insulating layer.

An electronic component 123 is mounted on pads 122 that are formed on the upper surface of the wiring board 120. The electronic component 123 is a semiconductor chip that includes, for example, a processing circuit, such as a CPU, and a signal processing circuit (for example, a RF circuit). Pads 124, which are formed on the upper surface of the wiring board 120, are electrically connected to pads 131 of the wiring board 130 through solder balls 102. The solder ball 102 is a metal core-solder ball, similar to the solder ball 101. Meanwhile, the solder ball 102 may be a solder ball including a resin core or a solder ball not including a metal core.

An electronic component 133 is mounted on pads 132 that are formed on the upper surface of the wiring board 130. The electronic component 133 is, for example, a sensor. Further, a wiring pattern 134 having a predetermined shape is formed on the upper surface of the wiring board 130. The wiring pattern 134 is, for example, an antenna that is used for radio communication.

The semiconductor device 100 is activated by power that is supplied from the secondary battery 30 built in the wiring board 10. Further, the secondary battery 30 is charged with power that is generated by the electronic component 111 (power generator) mounted on the wiring board 10. That is, the secondary battery 30 is charged and discharged by the operation of the semiconductor device 100.

Meanwhile, a space between the wiring boards 10 and 120 and a space between the wiring boards 120 and 130 may be filled with a resin, and the electronic components 112 and 123 mounted on the wiring boards 10 and 120 and the solder balls 101 and 102 connecting the wiring boards 10, 120, and 130 may be sealed with a resin. The resin, which is filled as described above, protects the electronic components 112 and 123 and connecting portions. Further, the filled resin improves connection strength between the wiring boards 10 and 120 and connection strength between the wiring boards 120 and 130.

Next, a method of manufacturing the wiring board 10 will be now described.

Figure 4A:
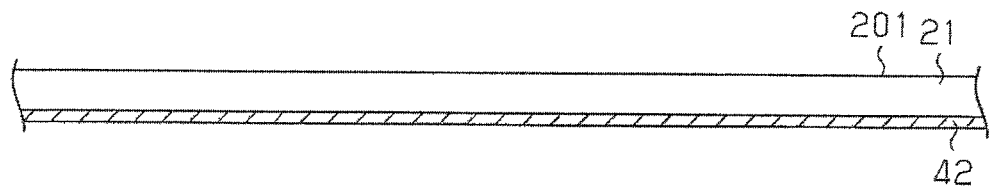
FIGS. 4A to 4E are schematic cross-sectional views illustrating a method of manufacturing the wiring board.

As shown in FIG. 4A, a base 201 is prepared. The base 201 includes the insulating layer 21 and the metal foil 42 that is formed on one main surface of the insulating layer 21. The material of the insulating layer 21 is, for example, an epoxy resin. The material of the metal foil 42 is, for example, copper. The base 201 is formed by, for example, applying an adhesive to the surface of a resin film and thermally pressing a metal foil on the adhesive.

Figure 4B:
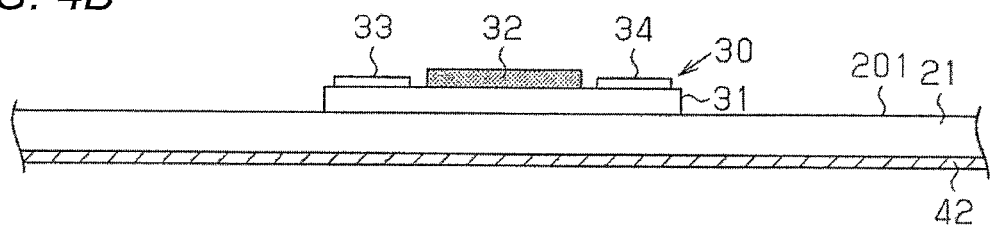

Next, as shown in FIG. 4B, the secondary battery 30 is mounted on the upper surface of the insulating layer 21 of the base 201. The secondary battery 30 is bonded to the upper surface of the insulating layer 21 via an adhesive (not shown).

Especially, the surface of the substrate 31 opposite to the surface of the substrate 31 on which the electrodes 33 and 34 are formed is bonded to the insulating layer 21.

Figure 4C:
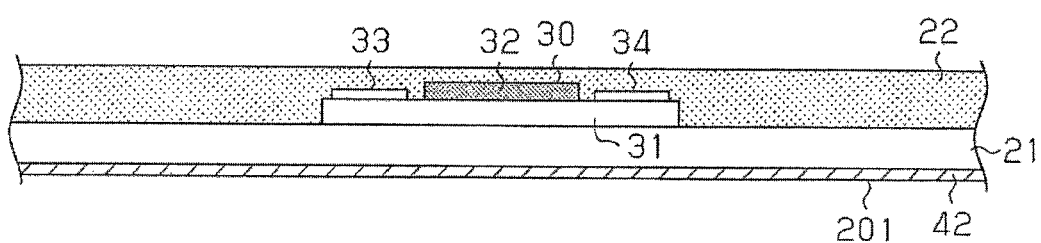

Further, as shown in FIG. 4C, the second insulating layer 22 is formed on the insulating layer 21 so as to cover the secondary battery 30. For example, sheet-like silicone elastomer, which has the same size as the size of the first insulating layer 21, is attached to the first insulating layer 21 so as to cover the secondary battery 30. The second insulating layer 22 covers the upper surface and the side surfaces of the secondary battery 30. Meanwhile, liquid silicone elastomer having a predetermined thickness may be applied to the first insulating layer 21 such that the second insulating layer 22 covers the secondary battery 30.

Figure 4D:
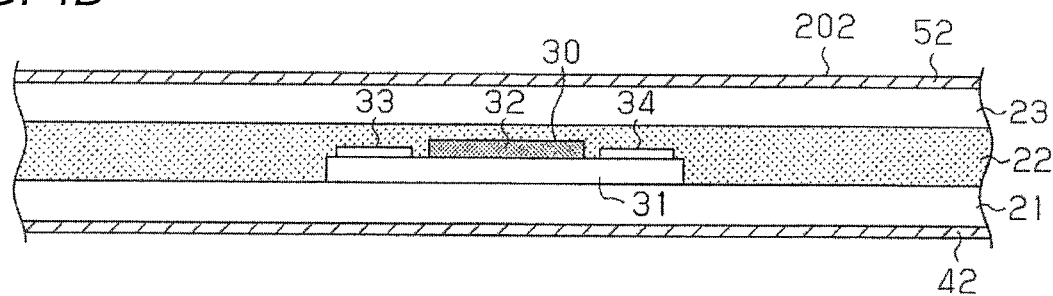

Next, as shown in FIG. 4D, the same base 202 as the base 201 is provided on the insulating layer 22. The base 202 includes the insulating layer 23 and the metal foil 52. Further, the first to third insulating layers 21 to 23 and the metal foils 42 and 52 are firmly adhered to each other by being heated and pressed in vacuum atmosphere, for example.

Figure 4E:
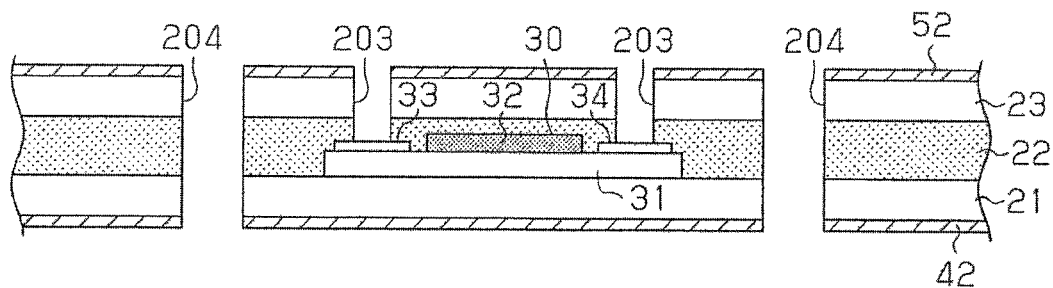

Furthermore, as shown in FIG. 4E, via holes 203 are formed so that portions of the surfaces of the electrodes 33 and 34 are exposed to the outside. Moreover, through holes 204 are formed through the insulating layers 21 to 23 and the metal foils 42 and 52. The via holes 203 are formed by removing portions of the metal foil 52 corresponding to the electrodes 33 and 34 by, for example, etching; and removing portions of the insulating layers 23 and 22 corresponding to the electrodes 33 and 34 by, for example, machining such as laser machining. Likewise, the through holes 204 are formed by removing portions of the metal foils 42 and 52 by, for example, etching; and removing portions of the insulating layers 21 to 23 by, for example, machining such as laser machining. After that, when resin dusts, contamination, or the like is generated through a drilling process, a process for removing the resin dusts or contamination (deburring, desmearing, or the like) is performed.

Meanwhile, the via holes 203 and the through holes 204 may be formed by one step. For example, the portions of the metal foil 52 and the portions of the insulating layers 23 and 22, which correspond to the electrodes 33 and 34, are removed by, for example, machining such as laser machining. Likewise, the portions of the metal foils 42 and 52 and the portions of the insulating layers 21 to 23 are removed by, for example, machining such as laser machining.

Figure 5A:
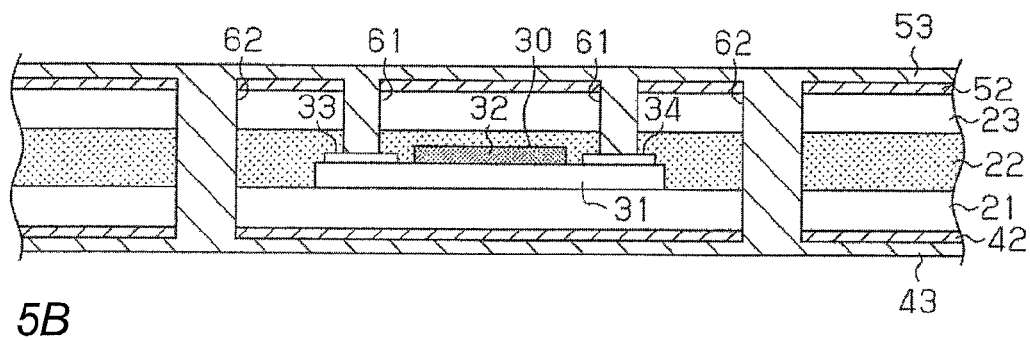
FIGS. 5A to 5D are schematic cross-sectional views illustrating the method of manufacturing the wiring board.

Next, as shown in FIG. 5A, the conductor layers 43 and 53, the vias 61, and the through vias 62 are formed by electroless plating and electrolytic plating. For example, a seed layer (not shown) is formed on the surfaces of the metal foils 42 and 52 and the inner peripheral surfaces of the via holes 203 and the through holes 204 by the electroless plating of copper. Further, the conductor layers 43 and 53, the vias 61, and the through vias 62 are formed by the electrolytic plating of copper in which the metal foils 42 and 52 and the seed layer are used as electrodes. Furthermore, the via holes 203 and the through holes 204 are filled with conductive paste after a conductor film is formed on the inner walls of the via holes 203 and the through holes 204 by electroless plating and electrolytic plating so that the vias 61 and the through vias 62 can also be formed by the conductor film and the conductive paste.

The surfaces of the electrodes 33 and 34 of the secondary battery 30 are subjected to a zincate treatment (zinc substitution treatment). The zincate treatment prevents an oxide film from being formed on the corresponding surfaces of the electrodes 33 and 34. For example, an oxide film is formed on the surface of aluminum or an aluminum alloy, which has not been subjected to a zincate treatment, in the atmosphere or during the laser machining for forming the via holes 203. This oxide film makes the adhesion of plating deteriorate. Accordingly, since the electrodes 33 and 34 of the secondary battery 30 are subjected to a zincate treatment in advance, it is possible to make the electrodes 33 and 34 adhere to the vias 61 and 61.

Figure 5B:
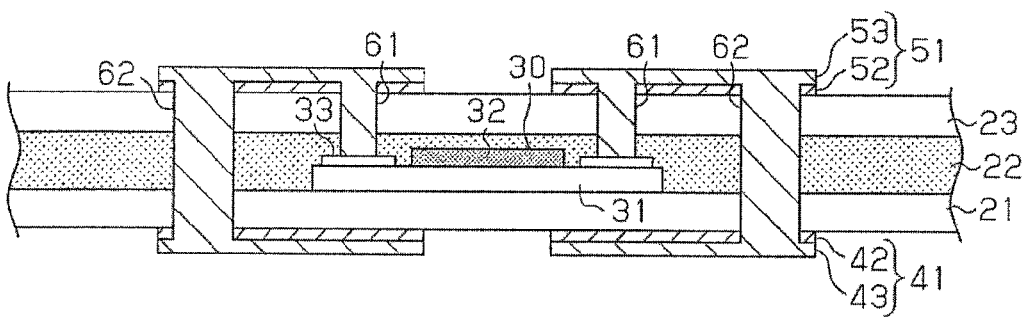

Next, patterning is performed on the metal foils 42 and 52 and the conductor layers 43 and 53 so that the wiring layers 41 and 51 are formed as shown in FIG. 5B. For example, a photosensitive resist film is formed on each of the surface of the conductor layers 43 and 53 as shown in FIG. 5A, and the resist film is subjected to exposure and development so that a mask is formed. Further, the metal foils 42 and 52 and conductor layers 43 and 53 are etched through openings of the mask so that the wiring layers 41 and 51 are formed as shown in FIG. 5B.

Figure 5C:
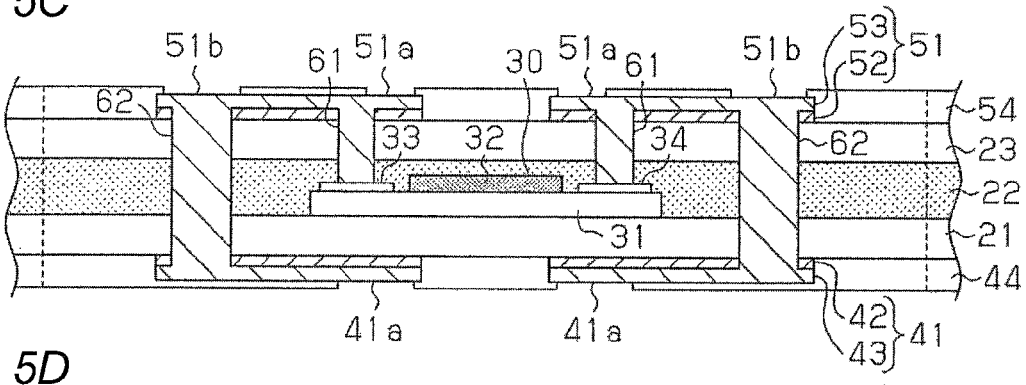

Next, as shown in FIG. 5C, the solder resists 44 and 54 including openings through which the pads 41a, 51a, and 51b are exposed are formed. For example, a photosensitive resist is applied on the surfaces of the insulating layers 21 and 23 and the wiring layers 41 and 51 as shown in FIG. 5B, and the resist is subjected to exposure and development so that the solder resists 44 and 54 are formed as shown in FIG. 5C. Meanwhile, a sheet-like photosensitive resist film may be attached and the resist film may be subjected to exposure and development so that the solder resists 44 and 54 are formed as shown in FIG. 5C.

Figure 5D:
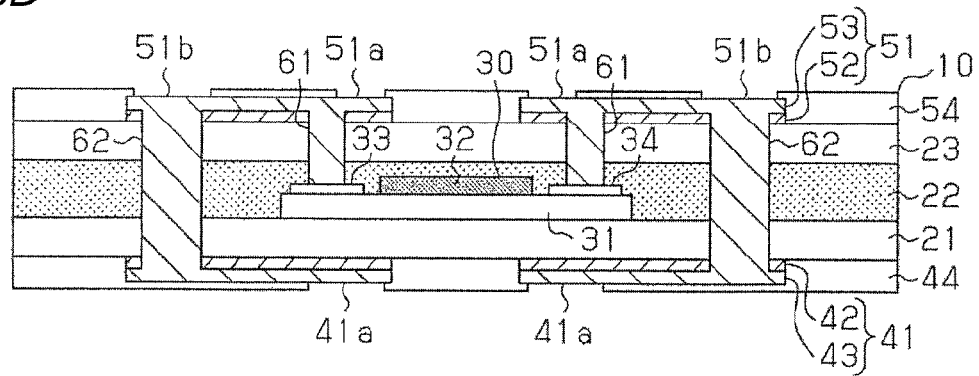

Further, this laminated body is divided by a dicer, a router, or the like at positions indicated by a broken line of FIG. 5C. Accordingly, the wiring board 10 is obtained as shown in FIG. 5D. As described above, according to this embodiment, the following effects are obtained.

(1) The wiring board 10 includes the board body 20, and the secondary battery 30 is built in the board body 20. The board body 20 includes the insulating layers 21, 22, and 23. The secondary battery 30 is embedded in the second insulating layer 22. The secondary battery 30 is fixed to one main surface (the upper surface in FIG. 1) of the first insulating layer 21 by, for example, an adhesive, and is covered with the second insulating layer 22. The secondary battery 30 is a component whose volume changes due to the use thereof, and is, for example, an all-solid-state thin film secondary battery. Further, the material of the second insulating layer 22 is a resin (low-rigidity resin) whose rigidity is lower than the rigidities of the first and third insulating layers 21 and 23. Since the second insulating layer 22 made of a low-rigidity resin allows the volume change of the secondary battery 30, a force caused by the volume change is not easily applied to the secondary battery. Accordingly, the second insulating layer 22 suppresses the damage of the secondary battery 30 whose volume changes due to the use thereof. The wiring board 10 becomes a defective product when the secondary battery 30 that is built in the wiring board 10 is damaged. Accordingly, it is possible to suppress the wiring board 10 to be a defective product.

(2) The secondary battery 30 is fixed (for example, bonded) to the first insulating layer 21, which has high rigidity, by the second insulating layer 22 that covers the secondary battery 30. Further, the wiring board 10 includes the third insulating layer 23 whose rigidity is the same as the rigidity of the first insulating layer 21. Furthermore, the wiring board 10 includes the through vias 62 that pass through the first to third insulating layers 21 to 23. These allow to maintain the substantially constant thickness of the wiring board 10 that is in use. Moreover, the electrodes 33 and 34, which are formed on the surface of the substrate 31 covered with the second insulating layer 22, are electrically connected to the wiring layer 51 by the vias 61. For this reason, the vias 61 and the electrodes 33 and 34 can be stably connected to each other.

Other Embodiments

Meanwhile, the embodiment may have the following aspects.

Figure 6A:
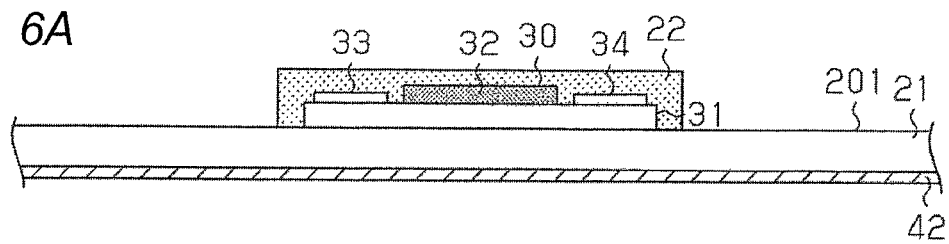
FIGS. 6A to 6C are schematic cross-sectional views of a wiring board according to another embodiment.
Figure 6B:
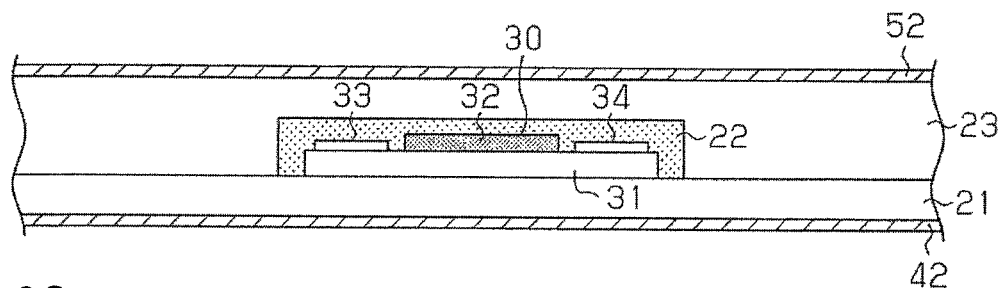
Figure 6C:
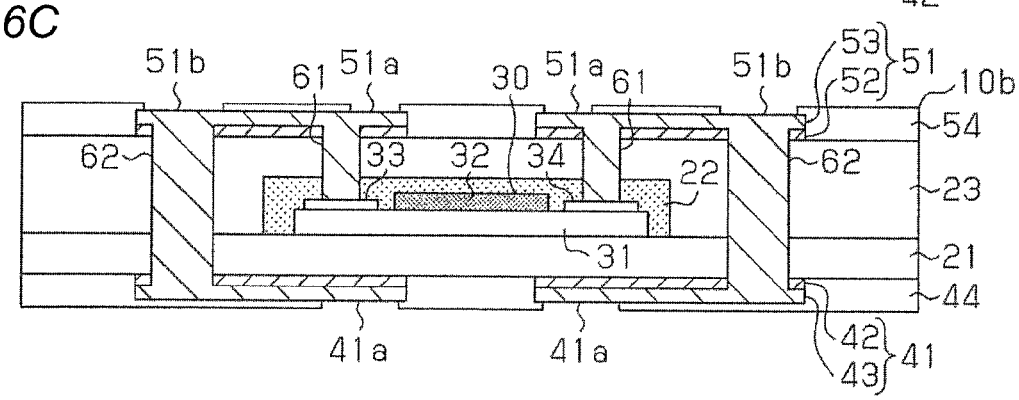

As long as the second insulating layer 22 can allow the change of the shape of the secondary battery 30, the second insulating layer 22 is not limited to the shape in the above-mentioned embodiment. For example, in the step of forming the second insulating layer 22 shown in FIG. 4C, the second insulating layer 22 is formed so as to cover a secondary battery 30 that is placed on the upper surface of a first insulating layer 21 as shown in FIG. 6A. Further, as shown in FIG. 6B, a third insulating layer 23 is formed so as to cover the upper surface of the first insulating layer 21 and the surface of the second insulating layer 22. For example, the third insulating layer 23 may be formed by forming a resin layer, which is made of the same material as the material of the first insulating layer 21, on the upper surface of the first insulating layer 21 except for a portion on which the second insulating layer 22 is formed, and providing an insulating layer with a metal foil so that the insulating layer covers the resin layer and the second insulating layer 22. Furthermore, similar to the step shown in FIG. 5C, this laminated body is divided by a dicer, a router, or the like, so that a wiring board 10b shown in FIG. 6C is obtained.

The board body 20 containing the secondary battery 30 therein may be used as a core substrate of a multilayer wiring board. For example, as shown in FIG. 7, a core substrate 211 of a wiring board 210 includes the first to third insulating layers 21, 22, and 23 and the secondary battery 30 that is covered with the second insulating layer 22.

An insulating layer 221 and a wiring layer 222 are formed on the lower surface of the first insulating layer 21, and a portion of the insulating layer 221 and the wiring layer 222 are covered with a solder resist layer 223. An insulating layer 231 and a wiring layer 232 are formed on the upper surface of the third insulating layer 23, and a portion of the insulating layer 231 and the wiring layer 232 are covered with a solder resist layer 233. The solder resist layers 223 and 233 include openings through which a portion of the wiring layers 222 and 232 are exposed to the outside so as to form pads. The pads thus formed are used for the mounting of electronic components or the connection of external connection terminals.

The insulating layers 221 and 231 and the wiring layers 222 and 232 are formed by, for example, a build-up method. First, a resin film made of an epoxy resin, a polyimide resin, or the like is formed on the first insulating layer 21 and the third insulating layer 23 so that the insulating layers 221 and 231 are formed. Then, via holes are formed in the insulating layers 221 and 231 by, for example, laser machining. After that, the wiring layers 222 and 232 formed of copper plated films are formed by, for example, a semi-additive method.

Figure 7:
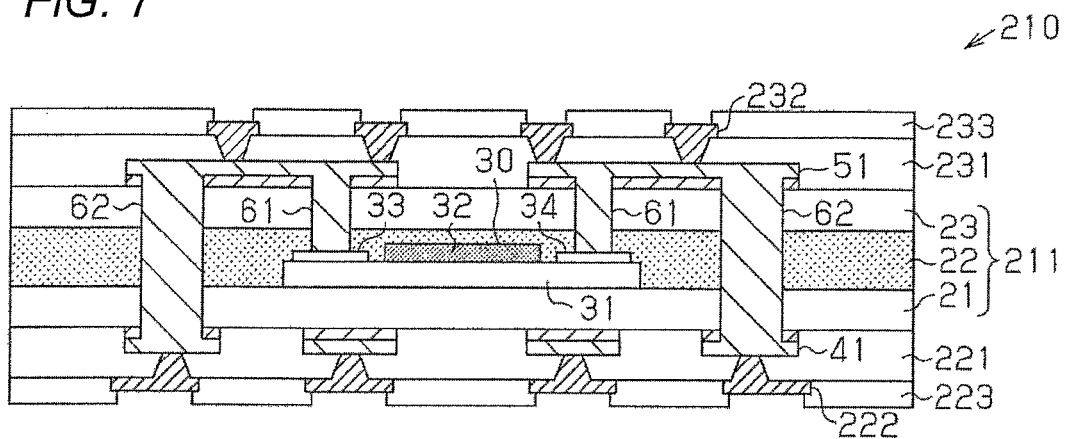
FIG. 7 is a schematic cross-sectional view of a wiring board according to another embodiment.

Meanwhile, as shown in FIG. 7, the insulating layer 231 and the wiring layer 232 are formed on the upper surface of the core substrate 211 and the insulating layer 221 and the wiring layer 222 are formed on the lower surface of the core substrate 211. The number of the insulating layers and the wiring layers, which are formed on the upper surface and the lower surface of the core substrate, may be appropriately changed. Further, the number of the insulating layers and the wiring layers that are formed on the upper surface of the core substrate may be different from the number of the insulating layers and the wiring layers that are formed on the lower surface of the core substrate. Furthermore, the insulating layers and the wiring layers may be formed on any one of the upper and lower surfaces of the core substrate. Moreover, similar to the wiring board 10b shown in FIG. 6C, the second insulating layer 22 covering the secondary battery 30 may be partially formed on the first and third insulating layers 21 and 23 in a multilayer wiring board.

Figure 8:
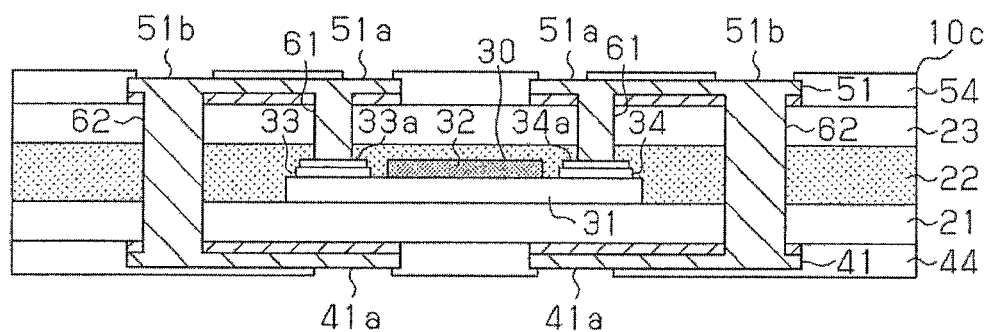
FIG. 8 is a schematic cross-sectional view of a wiring board according to another embodiment.

As shown in FIG. 8, bumps 33a and 34a are formed on the electrodes 33 and 34. The materials of the bumps 33a and 34a are, for example, gold (Au). Meanwhile, copper, solder, or the like may be used as the material of the bump. The secondary battery 30 where the bumps 33a and 34a have been formed is fixed to the first insulating layer 21, and the secondary battery 30 is covered with the second insulating layer 22. Further, via holes 203 are formed so that the upper surfaces of the bumps 33a and 34a are exposed to the outside (see FIG. 4E). Accordingly, since the electrodes 33 and 34 made of aluminum are irradiated with a laser beam of a machining apparatus that is used to form the via holes 203, an aluminum oxide film is not formed. When the bumps 33a and 34a are formed as described above, a zincate treatment performed on the electrodes 33 and 34 made of aluminum may be omitted.

The secondary battery 30 may be embedded in the second insulating layer 22, that is, the entire surface of the secondary battery 30 may be covered with the second insulating layer 22.

A plurality of secondary batteries may be built in the board body 20. Electronic components (for example, a semiconductor chip, a capacitative element, and a resistive element) except for the secondary battery and the secondary battery may be built in the board body 20. Further, electronic components except for the secondary battery may be built in the board body 20.

A resin film with a metal foil has been used in the step shown in FIG. 4A, but a resin film without a metal foil may be used and the metal foils 42 and 52 may be formed in the subsequent step. As a method of forming the metal foils 42 and 52, there are, for example, electroless plating, sputtering, deposition, a method of removing a resin film after attaching a resin film with a metal foil, and the like. Meanwhile, the resin film in the step shown in FIG. 4D is the same as described above.

Various aspects of the subject matter described herein are set out non-exhaustively in the following numbered clauses:

1. A method of manufacturing a wiring board, the method comprising:

(a) disposing a secondary battery on one surface of a first insulating layer;

(b) forming a second insulating layer on the secondary battery;

(c) forming a third insulating layer on the second insulating layer;

(d) forming a wiring layer on one surface of the third insulating layer; and (e) forming a via through the third and second insulating layers so as to electrically connect the wiring layer to an electrode of the secondary battery, wherein a rigidity of the second insulating layer is lower than those of the first and third insulating layers.

2. The method according to clause 1, further comprising:

(f) forming a bump on the electrode of the secondary battery, and wherein step (e) comprises forming the via through the third and second insulating layers so as to electrically connect the wiring layer to the bump.

3. The method according to clause 1, wherein step (c) comprises covering the second insulating layer with the third insulating layer such that the third insulating layer contacts the first insulating layer.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A wiring board comprising:
    a first insulating layer;
    a secondary battery on a first surface of the first insulating layer;
    a second insulating layer disposed on the first surface of the first insulating layer so as to cover the secondary battery, the second insulating layer comprising a second insulating layer lower surface in contact with the first surface of the first insulating layer, and a second insulating layer upper surface that is opposite from the second insulating layer lower surface;
    a third insulating layer disposed on and covering the second insulating layer upper surface, the third insulating layer comprising a third insulating layer lower surface in contact with the second insulating layer upper surface, and a third insulating layer upper surface that is opposite from the third insulating layer lower surface;
    a first wiring layer disposed on the third insulating layer upper surface; and
    a via electrically connecting the first wiring layer to an electrode of the secondary battery, the via passing through the second insulating layer and the third insulating layer,
    wherein a rigidity and a tensile strength of the second insulating layer is lower than those of the first and third insulating layers.

2. The wiring board according to claim 1, further comprising:
    a bump on the electrode of the secondary battery,
    wherein the via electrically connects the bump to the first wiring layer.

3. The wiring board according to claim 1, further comprising:
    a second wiring layer on a second surface of the first insulating layer, which is opposite to the first surface of the first insulating layer; and
    a through via that electrically connects the second wiring layer to the first wiring layer.

4. The wiring board according to claim 1, further comprising:
    a plurality of wiring layers and insulating layers on at least one of the first insulating layer and the third insulating layer.

5. The wiring board according to claim 1,
    wherein the secondary battery is an all-solid-state thin film secondary battery.

6. The wiring board according to claim 1, wherein the via directly contacts the electrode of the secondary battery.

7. The wiring board according to claim 6, wherein the via directly contacts the first wiring layer.

* * * * *